United States Patent
Uhov et al.

(10) Patent No.: US 8,111,075 B2
(45) Date of Patent: Feb. 7, 2012

(54) ELECTRONIC CIRCUIT WITH CAPACITIVE SWITCHING ABILITY

(75) Inventors: Andrei Uhov, St. Petersburg (RU); Nikolay Nikitin, St. Petersburg (RU); Dmitry Sazanov, St. Petersburg (RU)

(73) Assignee: Electrolux Home Products Corporation N.V., Zaventem (BE)

( * ) Notice: Subject to any disclaimer, the term of this patent is extended or adjusted under 35 U.S.C. 154(b) by 631 days.

(21) Appl. No.: 12/064,259

(22) PCT Filed: May 26, 2006

(86) PCT No.: PCT/EP2006/062634
§ 371 (c)(1), (2), (4) Date: Jul. 28, 2008

(87) PCT Pub. No.: WO2007/025785
PCT Pub. Date: Mar. 8, 2007

(65) Prior Publication Data
US 2008/0303536 A1     Dec. 11, 2008

(30) Foreign Application Priority Data
Aug. 31, 2005 (EP) .................................. 05105180

(51) Int. Cl.
*G01R 27/26* (2006.01)
*G08B 13/26* (2006.01)

(52) U.S. Cl. ...................................... 324/673; 340/562
(58) Field of Classification Search ................. 324/673; 340/562
See application file for complete search history.

(56) References Cited

U.S. PATENT DOCUMENTS

| | | | | |
|---|---|---|---|---|
| 5,554,973 A | * | 9/1996 | Kawashima et al. | 340/562 |
| 6,456,477 B1 | * | 9/2002 | McIntosh et al. | 361/115 |
| 7,323,886 B2 | * | 1/2008 | Lee | 324/679 |

FOREIGN PATENT DOCUMENTS

| | | |
|---|---|---|
| DE | 2148775 | 4/1973 |
| DE | 4340481 | 3/1995 |
| JP | 55112512 | 8/1980 |
| JP | 10064386 | 3/1998 |

* cited by examiner

*Primary Examiner* — Jeff Natalini
(74) *Attorney, Agent, or Firm* — Pearne & Gordon LLP

(57) ABSTRACT

Electronic circuit for the detection of a capacitive variation on two distinct contact capacitors, (C1, C2), comprising means able of squaring the signals generated by a conventional pulse generator and filtered by two filters (R1, C1-R2, C2), wherein the respective capacitors (C1, C2) are the same said contact capacitors which are connected to a respective terminal to a common ground (G); said means are also able to generate respective signals formed of trains of squared pulses, to compare said two signals and to provide an output signal depending on the result of said signals comparison. Said output signal depends on the phase difference between the pulses of said two trains of squared pulses.

8 Claims, 4 Drawing Sheets

ELECTRONIC CIRCUIT WITH CAPACITIVE SWITCHING ABILITY

Figure 1:
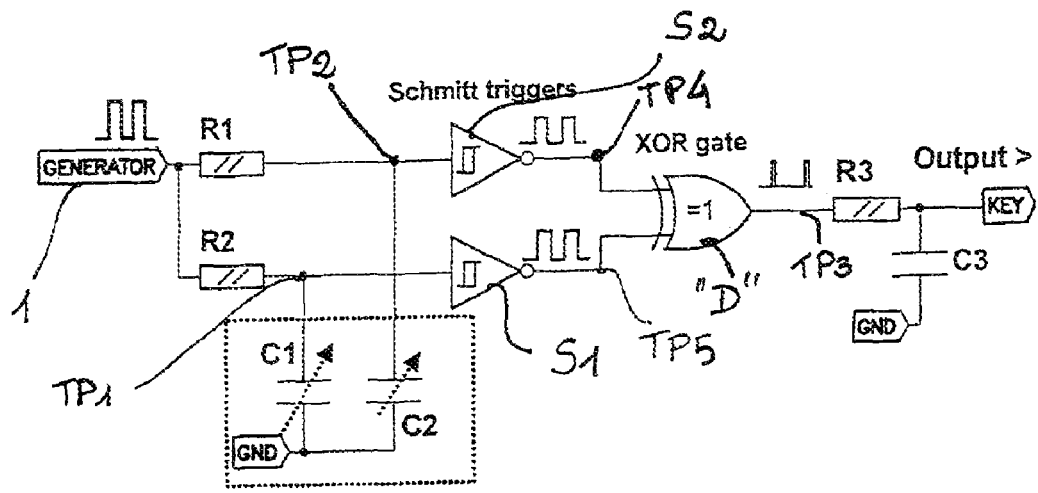

The present invention relates to an improved type of capacitive sensor, able to affect the behaviour of an electronic circuit, particularly of the type operating as a switch according to a variation of the capacitance detected by said sensor.

In the following of the description it will be specifically referred to a sensor of the capacitive type, to be used for the control of household appliances, but it will be understood that the instant invention applies to any kind of working application wherein a capacitive "touch control" sensor is used.

It is well known the general requirement of controlling the operation of household appliances without using switches, buttons, etc. or further types of mechanical controls, due to many reasons:
  one reason is the cost; due to the continuous decrease of the cost of the electronic devices, the mechanic devices, as switches, have become less and less competitive;
  the second reason is offered by the function reliability; as a matter of facts, in a damp and also a little dirty environment, as usually is an home environment, it can easily happen that some dirt may enter a mechanical device, what in the long run may compromise the correct operation.
  The third reason regards the outer size; as well known, the mechanical devices of the commercial type show sizes which cannot be reduced under a certain amount, and that may compromise the aesthetics and the general appliance structure.

In order to remove such negative factors, some types of "touch control" commands have been developed, whose working operation consists in the capacitance variation detected by a proper capacitive sensor and which affects the operation of a pre-determined switching/selection circuit.

Said capacitance variation is produced by a simple approaching, or contact, by the user on a proper household surface, what generates a corresponding capacitance variation, above described, on an underlying device.

A number of circuits able of detecting a capacitance variation are well known in the art; they can be grouped in circuits of the type "voltage divider", or "bridge" circuits, or even circuits based on the frequency variation of a proper multivibrator.

Such circuits are generally effective and also reliable from a working point of view, however they do show the common drawback that they are quite expensive and affectable by further problems, as for instance the fact they can easily be unbalanced and get out of calibration.

Moreover, due to the electrostatic voltages that can be generated in the environment, and due to the nature of the low voltage electronic components which are used, some remarkable safety problems may be encountered, therefore generating overall reliability problems.

For example the Japan Patent (application) 10154037, using a zener diode, and further components, to solve the problems which are induced by possible over-voltages on a touch sensor; however such patent requires the use of a number of electronic components which are quite expensive; moreover such patent doesn't solve the possible unwanted unbalance problems that may arise.

From U.S. Pat. No. 6,583,676 B2 it is divulged a circuit, able of detecting the proximity/touch signal, provided with devices and of with working modes able to perform the automatic calibration; even in said case however the automatic calibration cannot completely avoid the casual unbalance of said circuit, and therefore the risk of unwanted sag up of the output signal.

Based on the foregoing considerations, it is therefore a purpose of the present invention to provide a kind of electronic circuit able of automatically and intrinsically compensating any unintentional variations of the level of the driving capacitance.

Such circuit moreover has to be easily producible with the existing technologies and must be competitive in the final costs and performing in the reliability.

These aims are reached in a special type of circuit provided with working and control means of the kind and operating in accordance with the characteristics recited in the appended claims.

Figure 2:
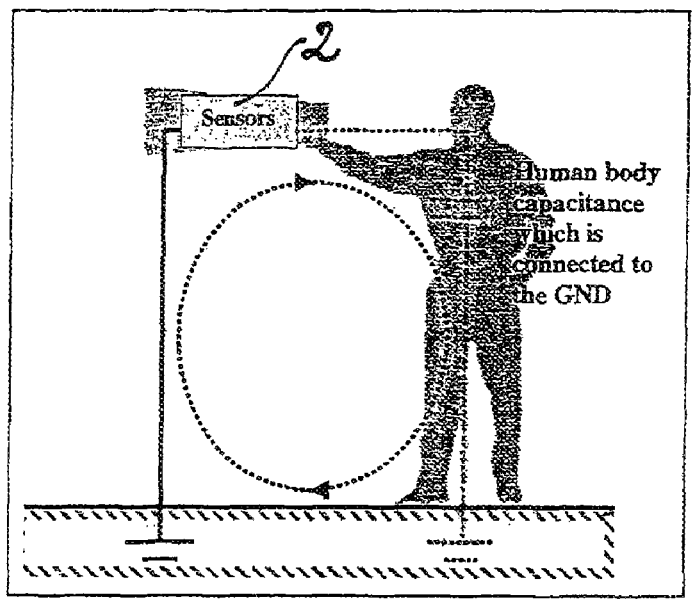
Figure 3:
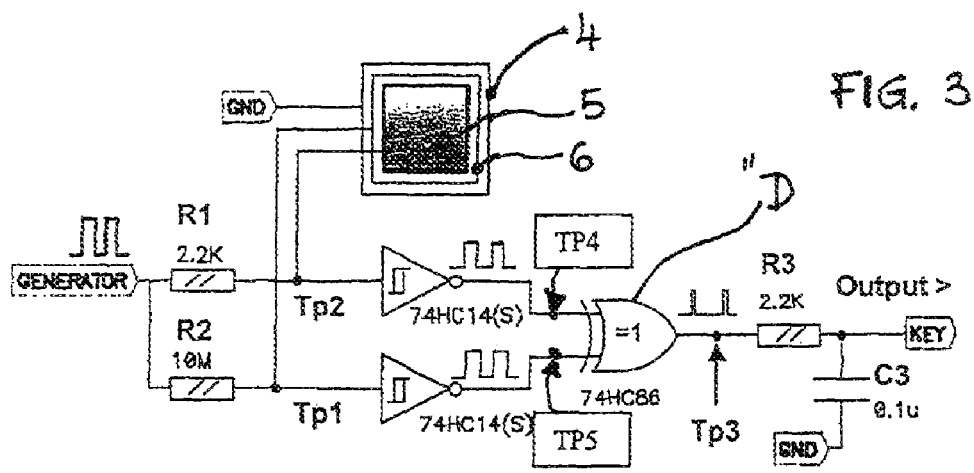
Figure 4:
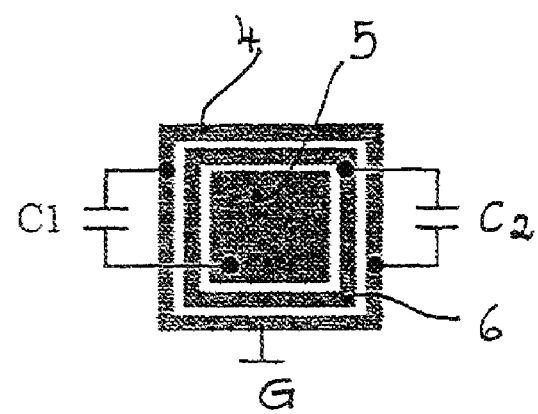
Figure 5:
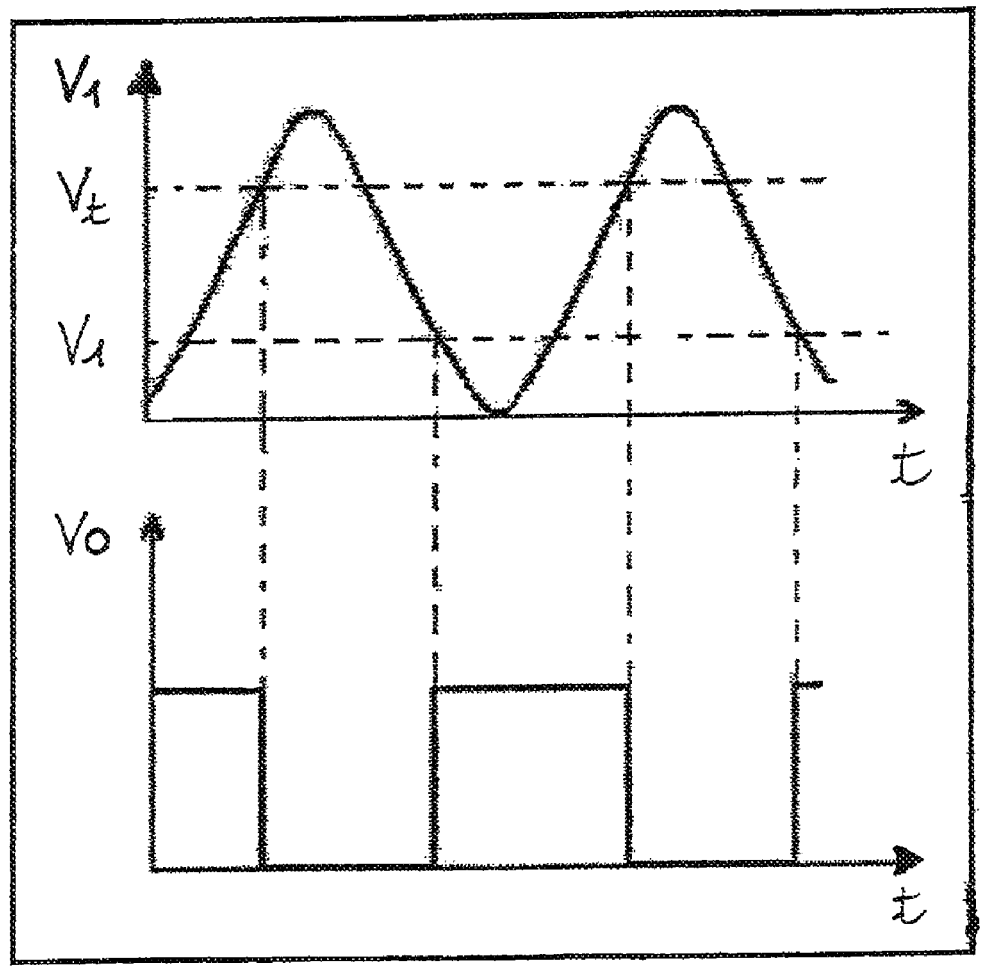
Figure 6:
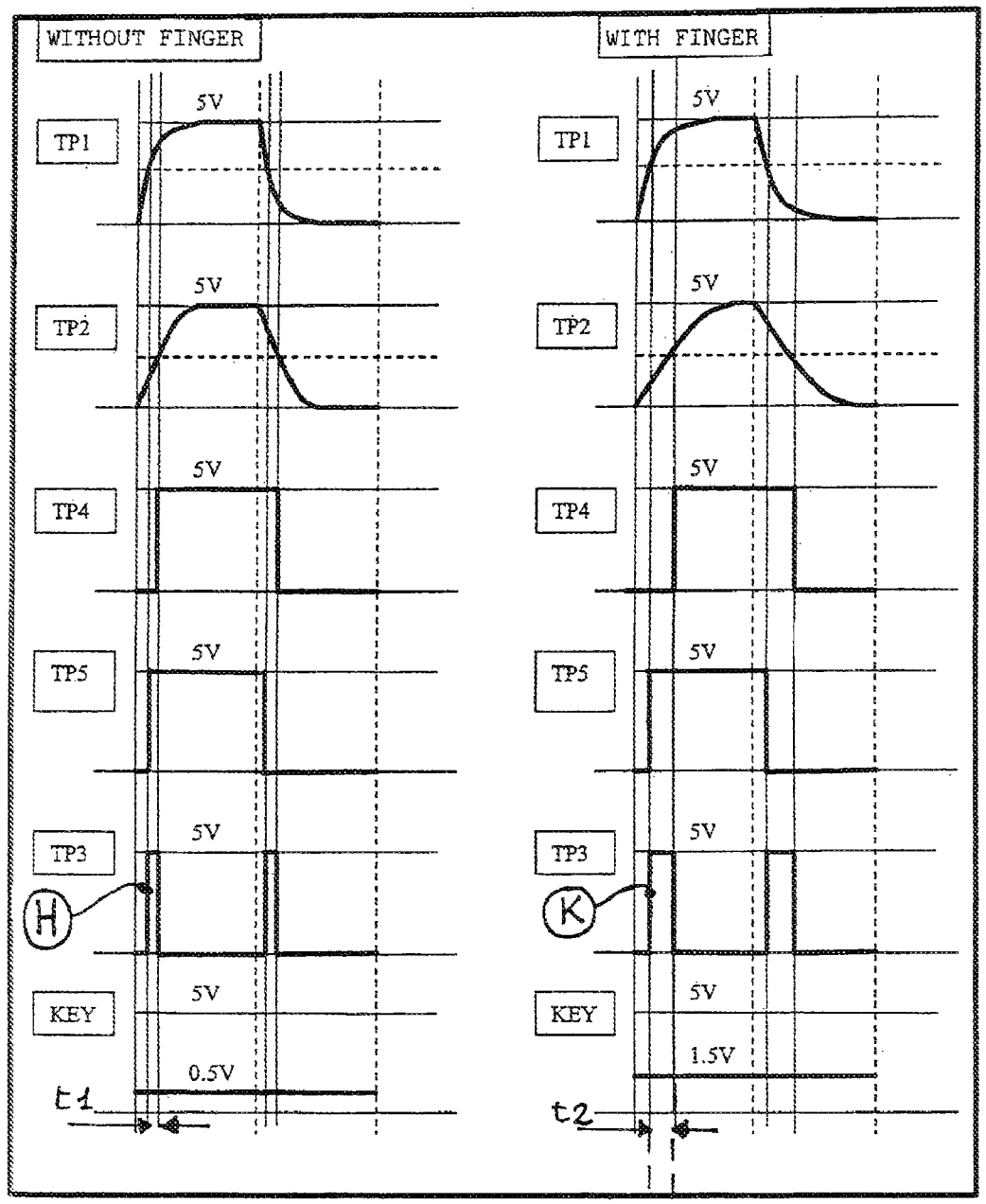

The present invention can be implemented according to a preferred, however not sole embodiment thereof, which will be described in detail and illustrated below by mere way of non-limiting ample with reference to the accompanying drawings, in which:

FIG. 1 is an overall principle schematic of the implementation of a circuit according to the invention, FIG. 2 shows a simplified schematic circuit of the capacitive coupling of an human body with regard to a capacitive sensor placed in the environment, FIG. 3 shows a general schematic of a preferred embodiment of the circuit of FIG. 1, FIG. 4 shows an enlargement of a sensor in FIG. 3, FIG. 5 shows symbolically and in the same chart the operation principle of an ideal squaring circuit, FIG. 6 shows some diagrams representing the wave forms of the pulses detected in respective points of a circuit according to the invention, in respective two working phases.

The main purpose of the invention is to make up a "bridge" circuit, i.e. a typically symmetrical circuit, wherein two electric quantities, which are nominally similar, are compared by proper comparison means, able to generate a signal corresponding to the result of said comparison.

It is generally known that in a stand-by situation, that is when a basically symmetrical "bridge" circuit is subjected in two symmetrical points by two similar electric signals, a normally coded and of low level signal in generated, that is recognized and processed as such by properly instructed utilization circuits.

When on the contrary said two signals are different, a different signal is being generated, and such difference is adequately understood and exploited.

The advantage of a "bridge" circuit consists in that, should the two compared INPUT signals were modified in a similar way, for instance due to a same drift of the characteristics of the components used in the relevant circuit, then the "bridge" circuit, whose special feature is to compare the two INPUT signals, is no more able to detect any relative modification between these signals, and therefore keeps on generating a signal corresponding to the situation as if said two INPUT signals would have been not modified.

To sum up the "bridge" circuit records and detects the relative variations between the INPUT signals, and provides an OUTPUT signal corresponding to said difference.

With ref. to FIG. 2, it is here explained that the invention is based on the principle of "capacitive coupling". An human body placed into contact with, or close to, a capacitive sensor 2, changes the capacity measured by said sensor.

Modern capacitive technology is based on the "charge-transfer" principle. A finger touch on a glass (plastics, stone, ceramic, and most kind of woods) will absorb some of the charge coupling and reduce the coupled charge. The signal of the sensor's processing circuit is then read by the processor. Enough of changes in the sensor's signal will indicate the touch.

With ref. to FIG. 1, the circuit according to the invention comprises:
- a pulse generator 1,
  - two input resistors, or impedences R1, R2 connected with respective terminals to said pulse generator,
  - two input capacitors C1, C2, whose two respective terminals are connected to ground (G), and the other respective terminals TP2, Tpi are connected to respective other terminals of each of said input resistors,
  - two squaring circuits or logical triggers S1, S2, of the pulse signals, whose input connections are linked to said other terminals 2, 3 and are apt to work according to a function that will be explained later on,
  - a device "D" able to compare the two output signals of said two pulse squaring circuits S1, S2, and to provide a respective output signal on a respective output terminal "TP3".

Said comparator circuit is therefore a circuit known as "XOR", and is made for instance by a device of the type 74HC86.

As to said two logical circuits S1 and S2 (triggers), they can be made up by logical circuits having the property of generating and transferring as OUTPUT a squared, pulse signal with pre-determined amplitude, its time length corresponding to the time interval with whom a nearly pulse INPUT signal, having an irregular shape, reaches, exceeds and remains at a predetermined threshold level; it will be understood that when said INPUT signal comes back below said threshold, the squared OUTPUT signal ends.

With ref. to FIG. 5, in the output characteristic of a common logical gate, the transition zone between the High level and the Low level is quite uncertain, as the relevant signal cannot be very steep.

On the contrary the Schmitt trigger, well known in the art, shows two switching thresholds which are very steep.

Starting from a null input voltage Vi, the output Vo of the trigger remains at the High level until Vi exceeds the so-called higher threshold Vt. From the level Low the output goes back at the level High only when the input voltage goes down below a lower threshold Vs, which is different and lower than said higher threshold Vt.

As apparently shown in the two diagrams in the chart of FIG. 5, the Schmitt trigger is being used as an effective squaring device, i.e. to turn into a square wave a signal having any shape.

With regard to the circuit "D", it is a comparator circuit, for instance of the type 74HC86; its function is to generate a pulse OUTPUT signal, wherein the leading edge of any OUTPUT pulse is synchronized with the leading edge of a pulse coming from a predefined of the two squaring circuits, and the trailing edge is synchronized with the leading edge of the pulse coming from the other squaring circuit.

In such a way the comparator circuit "D" generates a train of pulses whose time length depends only on the time interval, or delay, between the pulses coming from the squaring circuits, or even better between the relevant leading edges.

The FIG. 1 shows a perfectly symmetrical circuit, upstream of the comparator.

The FIG. 3 instead shows an actual circuit, wherein it may be observed that the impedances R1 and R2 show different values (2.2 k and 10 M). This is due to the fact that the two condensers C1 and C2 have different capacities, being implemented in a not symmetrical way as well.

As a matter of facts the condenser C1 is made of a first ring-like electrode 4 that is basically flat and as a ring, open inside, and of a second electrode 5 consisting of a surface placed inside of the perimeter of said first electrode 4.

The condenser C2 is made of a third annular electrode 6 and interposed between said first and second electrodes 4, 5, while the other electrode of C2 is provided by the same outer ring-like electrode 4 of C1, which then forms an electrode which is common to both capacitors.

Said outer ring-like electrode 4 is then connected to ground G.

It will be then apparent that the capacities of C1 and C2 are different, as the related geometry is quite different.

Such a constructional geometry is however wanted and imposed by the need of modifying in an asymmetrical way both capacities through only a user motion; in the facts, if a finger is approached to the central area of said capacitors, i.e. to the electrode 5, such an operation does modify, due to the before explained reasons, the capacities of both capacitors C1 and C2, but such variations are differentiated between them.

Reference is made now to the FIG. 6; the diagrams on the left column represent in a symbolic way the shapes of the pulses in the points there specified, when the two capacitors C1 and C2 are not approached by the user's finger, i.e. when the capacities of the two capacitors depend only on their geometric arrangement; the diagrams on the right column do show how the corresponding pulses are being modified, of course in the same measuring points, when instead the capacities of the two capacitors C1 and C2 are being modified, for instance when the central electrode 5 is touched by a finger.

Therefore a pulse train coming from the pulse generator 1, with no contact on the two capacitors C1 and C2, generates two almost aligned-up pulse trains in the points TP1 and TP2 (as the difference of capacity between the capacitors is at least partially compensated by the difference between the values of R1 and R2), and therefore two corresponding squared pulse trains, also almost aligned-up, in the points TP4 and TP5 (left column).

These signals, processed by the comparator circuit "D", generates a train of pulses "H" having a time length t1 very limited.

On the contrary, if a finger is approached to the central area of the two capacitors, then (FIG. 6, right column) the two capacities of C1 and C2 are changed in a different way, and as the impedances R1 and R2 remain constant, the two respective pulse trains in the points TP1 and TP2 are modified, at least in the sense that the shape of their leading edges are modified.

As a consequence the two squaring circuits S1 and S2 generate two respective squared signals, exactly similar in all features but in their phase, i.e. at the starting time, and these squared signals, introduced in the comparator circuit "D", generate a related OUTPUT signal constituted by a train of pulse "K" having a time length t2 longer of the time length of the pulses "H" just described.

The difference between the two signals "H" and "K" can be recognized and exploited by a man skilled in the art according to well known techniques, using known means and procedures, to exploit them to activate the corresponding control circuits.

Advantageously the OUTPUT signals generated by the circuit "D" may be not only of pulse type, but, with ref. to FIG. 1, on the OUTPUT point TP3 of the comparator "D" a levelling conventional circuit C3-R3, per se well known, is arranged; such circuit is effective in levelling the output signal, and therefore to provide, in correspondence of the two just explained working phases, and in the point identified by "KEY", two corresponding signals which are constant and on direct current (D.C) but with different amplitudes, at 0.5 V. and 1.5 V., as illustrated in the two diagrams in the lower part of FIG. 6, which for the rest is self-explaining.

Therefore it will be now clear the operation and the working of the circuit according to the invention; until there is no contact of a finger on the electrode 5, the two capacities of C1 and C2 preserve their initial values, and the circuit show at the points TP1 and TP2 such kind of pulses that, after a proper squaring action of the S1 and S2 circuits, and the subsequent comparison made by the circuit "D", a pulse train "H", with a time length of t1 is being generated; when instead the contact on the electrode is actually made, a pulse train "K", with a time length t2, which is remarkably different from t1, is generated; such a difference is being used to generate the command to be sent to the following controls and actuators which carry out the pre-determined operations corresponding to the contact on that specific electrode 5.

The invention claimed is:

1. Electronic circuit for the detection of a capacitive variation, for use in household appliances characterized in that the electronic circuit is able to detect a differentiated capacitive variation on two distinct contact capacitors, (C1, C2), and in that the electronic circuit comprises an apparatus that:
   squares, using squaring circuits, a signal generated by a common pulse generator and filtered by two parallel filters (R1, C1-R2, C2) to generate two respective signals of squared pulse trains (TP4, TP5), wherein respective capacitors (C1, C2) in the two filters are the two distinct contact capacitors (C1, C2), each of the two distinct contact capacitors being connected to a common ground (G),
   and compares said two signals of squared pulse trains (TP4, TP5) with a comparator device comprising a logic gate, and provides a direct-current output signal (KEY) depending on the result of said signals comparison.

2. Electronic circuit according to claim 1, characterized in that said direct-current output signal (KEY) depends on the phase difference between the pulses (H, K) of said squared pulse trains.

3. Electronic circuit according to claim 1, characterized in that the electronic circuit comprises:
   two input impedances (R1, R2), each of them having one respective terminal connected to said common pulse generator,
   the two distinct contact capacitors (C1, C2), each having one respective terminal connected to the common ground (G), and a respective other terminal (5, 6) being connected to another terminal of a respective one of said input impedances (R1, R2),
   two circuits (S1, S2) to produce squaring pulse signals, whose inputs are linked to said respective other terminals (5, 6) of said input impedances (R1, R2),
   the comparator device (D) that compares the two output signals from said two squaring circuits (S1, S2), and that provides said direct-current output signal (KEY) on a respective output terminal (TP3).

4. Electronic circuit according to claim 3, characterized in that: said comparator device (D) is a circuit (XOR) that compares two pulse input signals, obtained from the two output signals from said two squaring circuits (S1, S2), and that provides a logical predefined signal (KEY) as a function of the presence or absence of a phase difference, of a pre-determined level, between said two pulse input signals (TP4, TP5).

5. Electronic circuit according to claim 4, characterized in that said output terminal (TP3) is connected to said ground (G) through an output resistance (R3) in series with an output capacitor (C3), and that the final drawn voltage (KEY) is taken between said output resistor (R3) and said output capacitor (C3).

6. Electronic circuit according to claim 3, characterized in that said two distinct contact capacitors (C1, C2) show different capacities, and said two input impedances (R1, R2) show different values, and are sized so as to generate respective pulse trains having a basically similar amplitude, and the same phase.

7. Electronic circuit according to claim 1, characterized in that said squaring circuits are two Schmitt triggers.

8. Electronic circuit according to claim 1, characterized in that said two distinct contact capacitors (C1, C2) comprise respective couple of electrodes, wherein a first capacitor (C1) consist of a first ring-like electrode (4) which is basically flat and internally open, and of a second electrode (5) made of a surface which is placed inside the perimeter of said first electrode (4), and the second capacitor (C2) is formed by a third electrode (6) having an annular shape and is interposed between said first and second electrode (4, 5), while the other electrode of said second capacitor (C2) is made of the same ring-like outer electrode (4) of said first capacitor (C1), said ring-like outer electrode (4) being connected to ground (G).

* * * * *